(12) United States Patent
Chou et al.

(10) Patent No.: US 7,754,622 B2
(45) Date of Patent: Jul. 13, 2010

(54) PATTERNING METHOD UTILIZING SIBN AND PHOTOLITHOGRAPHY

(75) Inventors: Pao-Hwa Chou, Yamanashi (JP);
Kazuhide Hasebe, Yamanashi (JP);
Shigeru Nakajima, Yamanashi (JP);
Yasushi Akasaka, Yamanashi (JP);
Mitsuaki Iwashita, Yamanashi (JP);
Reiji Niino, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/441,741

(22) PCT Filed: Jun. 6, 2008

(86) PCT No.: PCT/JP2008/060480

§ 371 (c)(1),
(2), (4) Date: Mar. 18, 2009

(87) PCT Pub. No.: WO2008/149987

PCT Pub. Date: Dec. 11, 2008

(65) Prior Publication Data

US 2010/0112796 A1    May 6, 2010

(30) Foreign Application Priority Data

Jun. 7, 2007    (JP) ............................. 2007-151065

(51) Int. Cl.
*H01L 21/31*    (2006.01)
*H01L 21/469*    (2006.01)

(52) U.S. Cl. ..................................................... 438/786
(58) Field of Classification Search ...................... None
See application file for complete search history.

(56) References Cited

U.S. PATENT DOCUMENTS 7,601,647 B2 * 10/2009 Jeon et al. .................... 438/717
2008/0145536 A1 * 6/2008 Zhang et al. ............ 427/255.38

FOREIGN PATENT DOCUMENTS

JP      62126637 A    6/1987
JP     2000173979 A   6/2000

OTHER PUBLICATIONS

International Search Report for PCT/JP2008/060480 dated Jul. 1, 2008.

* cited by examiner

*Primary Examiner*—Scott B Geyer
(74) *Attorney, Agent, or Firm*—Pearne & Gordon LLP

(57) ABSTRACT

Disclosed is a patterning method including: forming, on a thin film, a sacrificial film made of a material different from that of the thin film and made of SiBN; processing the sacrificial film into a pattern having a preset interval by using a photolithography technique; forming, on sidewalls of the processed sacrificial film, sidewall spacers made of a material different from those of the sacrificial film and the thin film; removing the processed sacrificial film; and processing the thin film by using the sidewall spacers as a mask.

11 Claims, 7 Drawing Sheets

FIG. 7
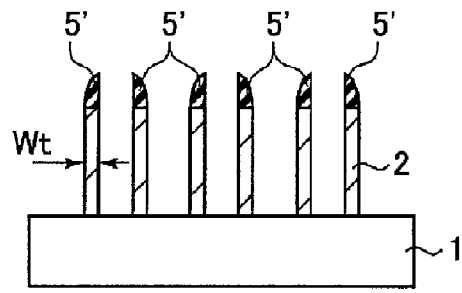
FIG. 8
|  | SiBN | MLD-SiN | CVD-SiN | CVD-SiN | Th-SiO$_2$ |
|---|---|---|---|---|---|
| Temp. | 550°C | 450°C | 450°C | 760°C | 1000°C |
| Hot H$_3$PO$_4$ [nm/min] | >200 | >200 | >200 | 48 | 1.48 |
| DHF 1% [nm/min] | 2 | 7 | 47 | 0.5 | 3 |
FIG. 9
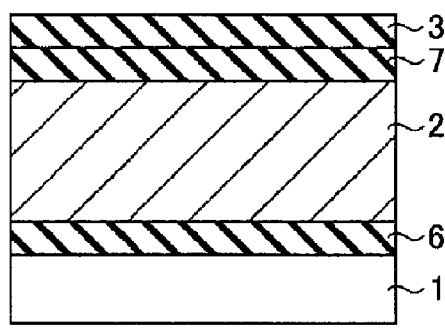

PATTERNING METHOD UTILIZING SIBN AND PHOTOLITHOGRAPHY

TECHNICAL FIELD

The present invention relates to a patterning method for use in a semiconductor process, for forming a pattern below or equal to a resolution limit of an exposure apparatus.

BACKGROUND ART

Along with the trend for high integration of a semiconductor device, a wiring width or an isolation width required for a manufacturing process thereof is being reduced. In general, formation of a micro pattern involves forming a resist pattern by using a photolithography technique; and then etching various kinds of underlying thin films by using the resist pattern as an etching mask.

To form the micro pattern, the photolithography technique is important. However, the recent miniaturization of the semiconductor device has progressed to the extent that a dimension no greater than a resolution limit of the photolithography technique is required.

An example technique for forming the pattern no greater than the resolution limit is disclosed in Patent Document 1. The technique of Patent Document 1 basically involves the steps of forming a silicon nitride film (hereinafter, referred to as "sacrificial film") on an underlying film at an interval equivalent to the resolution limit; forming a sidewall silicon oxide film (hereinafter, referred to as "sidewall spacer") on the sidewall of the sacrificial film; removing the sacrificial film while leaving the sidewall spacer; and etching the underlying film by using the remaining sidewall spacer as an etching mask.

According to this technique, since the width of the sidewall spacer can be reduced thinner than that of the sacrificial film, it is possible to form a pattern of the underlying film having a width no greater than the resolution limit by using the sidewall spacer as the etching mask.

Patent Document 1: Japanese Patent Laid-open Publication No. 2000-173979

DISCLOSURE OF THE INVENTION

Problems to Be Solved by the Invention

The sacrificial film should serve as a base body when forming the sidewall spacer and should be removed so that only the sidewall spacer remains on the underlying film. For this reason, it is required that the sacrificial film should not be damaged or easily etched when the sidewall spacer is formed, and should be easily removed without damaging the sidewall spacer or the underlying film. That is, there are two contradictory requirements imposed on the sacrificial film that it should have a certain level of strength and also be easily removed.

The sacrificial film described in Patent Document 1 is a silicon nitride film or a silicon oxide film. If these films are formed at a high temperature so as to increase the strength thereof, the film property thereof becomes strong so that they become difficult to etch but they are not easily removed.

On the contrary, if these films are formed at a low temperature so that they can be easily removed, the film property thereof becomes weak, whereby these films are easily removed or etched when the sidewall spacer is formed.

An object of the present invention is to provide a patterning method capable of forming a pattern of an underlying film having a width no greater than a resolution limit with excellent reproducibility and stability by forming a sacrificial film which has strength and can also be easily removed.

In view of the foregoing, a patterning method in accordance with a first aspect of the present invention includes: forming a thin film on a substrate; forming, on the thin film, a sacrificial film made of a material different from that of the thin film and made of SiBN; processing the sacrificial film into a preset pattern by using a photolithography technique; forming, on sidewalls of the processed sacrificial film, sidewall spacers made of a material different from those of the sacrificial film and the thin film; removing the processed sacrificial film; and processing the thin film by using the sidewall spacers as a mask.

Further, a patterning method in accordance with a second aspect of the present invention includes: forming a first thin film on a substrate; forming, on the first thin film, a second thin film made of a material different from that of the first thin film; forming, on the second thin film, a hard mask film made of a material different from that of the second thin film; forming, on the hard mask film, a sacrificial film made of SiBN; processing the sacrificial film into a pattern having a preset interval by using a photolithography technique; forming, on sidewalls of the processed sacrificial film, sidewall spacers made of a material different from those of the sacrificial film and the hard mask film; removing the sacrificial film; processing the hard mask film by using the sidewall spacers as a mask; and processing the second thin film by using the hard mask film as a mask.

EFFECT OF THE INVENTION

In accordance with the present invention, it is possible to provide a patterning method capable of forming a pattern of an underlying film having a width no greater than a resolution limit with excellent reproducibility and stability by forming a sacrificial film which has strength and can also be easily removed.

BRIEF DESCRIPTION OF THE DRAWINGS

FIG. 7 is a cross sectional view to illustrate a major manufacturing process of the patterning method in accordance with the first embodiment of the present invention;

FIG. 8 is a view showing properties of a film usable as a sacrificial film;

FIG. 9 is a cross sectional view to illustrate a major manufacturing process of the patterning method in accordance with a second embodiment of the present invention;

EXPLANATION OF CODES

Figure 1:
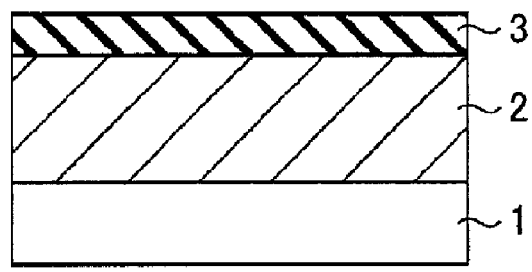
FIG. 1 is a cross sectional view to illustrate a major manufacturing process of a patterning method in accordance with a first embodiment of the present invention.

1: semiconductor substrate
2: thin film
3: sacrificial film
4: resist pattern
5: film
5': sidewall spacers
6: etching stopper film
7: hard mask film

BEST MODE FOR CARRYING OUT THE INVENTION

Hereinafter, embodiments of the present invention will be described in detail with reference to the accompanying drawings.

First Embodiment

FIGS. 1 to 7 provide cross sectional views to illustrate every major manufacturing process of a patterning method in accordance with a first embodiment of the present invention.

The first embodiment illustrates a basic processing sequence of the patterning method in accordance with the present invention.

First, as shown in FIG. 1, a thin film 2 is formed on a semiconductor substrate 1. In the present specification, the semiconductor substrate 1 does not merely imply a semiconductor substrate, e.g., a silicon substrate, but includes a structure body having, in or on the semiconductor substrate, a semiconductor device, a conductive film corresponding to an integrated circuit pattern and an interlayer insulating film which insulates them. The thin film 2 is processed into a micro pattern later. The thin film 2 may be an insulating film, or may be a conductive film. In the present embodiment, the thin film 2 is, e.g., conductive polysilicon. Then, formed on the thin film 2 is a sacrificial film 3 made of a material different from that of the thin film 2 and made of SiBN.

Figure 2:
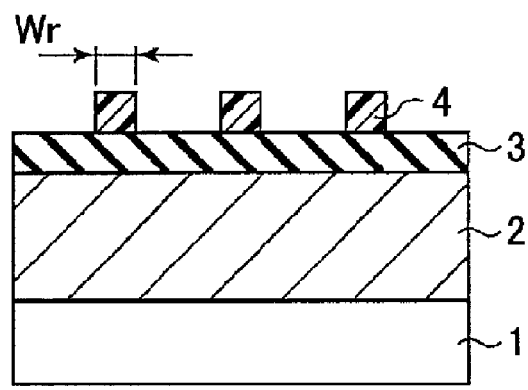
FIG. 2 is a cross sectional view to illustrate a major manufacturing process of the patterning method in accordance with the first embodiment of the present invention.

Subsequently, as shown in FIG. 2, photoresist is coated onto the sacrificial film 3 to form a photoresist film. Then, by using a photolithography technique, the photoresist film is formed into a resist pattern 4 having a preset interval. In the present embodiment, the resist pattern 4 has a line-and-space pattern, and the interval of the lines is set to be substantially equivalent to a resolution limit of an exposure apparatus for use in the photolithography technique. In the present embodiment, a width Wr of the resist pattern 4 along a plane direction is set to correspond to the resolution limit, for instance.

Figure 3:
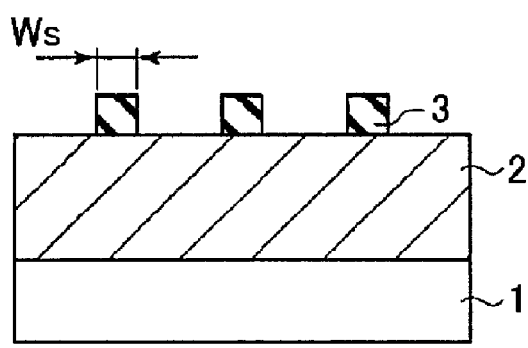
FIG. 3 is a cross sectional view to illustrate a major manufacturing process of the patterning method in accordance with the first embodiment of the present invention.

Thereafter, as illustrated in FIG. 3, the sacrificial film 3 is etched by using the resist pattern 4 as an etching mask and the sacrificial film 3 is processed into a pattern having a predetermined interval. A width Ws of the processed sacrificial film 3 along a plane direction is the same or almost the same as the width Wr of the resist pattern 4 so that the width Ws is set to be equivalent or approximately equivalent to the resolution limit. As an etchant used for etching the sacrificial film 3, for example, hot phosphoric acid (hot $H_3PO_4$) is used in case the sacrificial film 3 is a SiBN film. In addition, the etching can be performed by using an etchant containing SC-1 (mixed solution of ammonia and oxygenated water), FPM (Fluoric-Peroxide Mixture) solution ($HF/H_2O/H_2O_2$) and buffered hydrofluoric acid (BHF) ($NH_4F/HF/H_2$). Further, after etching the sacrificial film 3 by using the resist pattern 4, the sacrificial film 3 having the line width Ws can be further etched by using the above-stated etchant, so that the line width of the sacrificial film 3 can be reduced (or trimmed) to have a width smaller than Ws.

Figure 4:
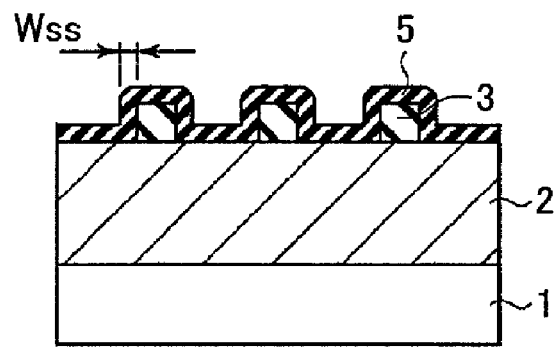
FIG. 4 is a cross sectional view to illustrate a major manufacturing process of the patterning method in accordance with the first embodiment of the present invention.

Then, as shown in FIG. 4, on the processed sacrificial film 3 and the thin film 2, there is formed a film 5 different from the sacrificial film 3 and the thin film 2. In the present embodiment, the film 5 is a silicon oxide film. One example of the silicon oxide film is MLD-$SiO_2$ which is deposited very thinly at a molecular layer level by using an MLD (Molecular Layer Deposition) method. By depositing the film 5 very thinly, a thickness of the film 5 formed on a sidewall of the sacrificial film 3 can be set to be a width Wss no greater than the resolution limit of the exposure apparatus. A basic film forming technique of the MLD method is disclosed in a patent application (Japanese Patent Application No. 2006-265818) filed by the same applicant as that of the present application. In the disclosure, a deposition is performed by alternately supplying a source gas, which contains, e.g., organic silicon, and oxygen species such as oxygen radicals activated (excited) by, e.g., plasma, a laser beam, ultraviolet light (wavelength: about 350 nm or less) or heat. Examples of the source gas containing the organic silicon are an ethoxysilane gas and an aminosilane gas. As the ethoxysilane gas, TEOS (tetraethoxysilane) may be used, for example. Further, as the aminosilane gas, TDMAS (tridimethylaminosilane), BTBAS (bistertiarylbutylaminosilane), BDMAS (bisdimethylaminosilane), BDEAS (bisdiethylaminosilane), DMAS (dimethylaminosilane), DEAS (diethylaminosilane), DPAS (dipropylaminosilane), BAS (butylaminosilane), DIPAS (diisopropylaminosilane) and BEMAS (bisethylmethylaminosilane) may be used, for example. Further, the oxygen species such as the oxygen radicals can be obtained, desirably, by exciting an oxygen containing gas into plasma.

Particularly, in case of using the MLD method, since a film thickness can be controlled at a molecular level, a CD (Critical Dimension) control is facilitated and a stable process can be performed.

Figure 5:
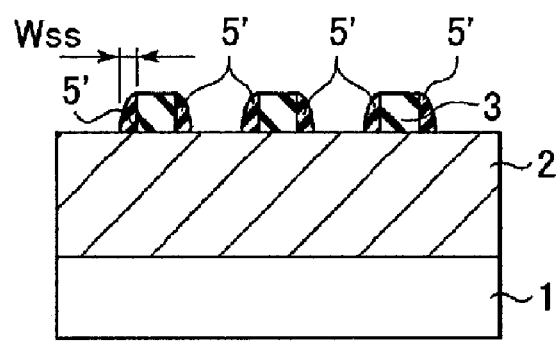
FIG. 5 is a cross sectional view to illustrate a major manufacturing process of the patterning method in accordance with the first embodiment of the present invention.

Thereafter, as illustrated in FIG. 5, the structure shown in FIG. 4 is etched and sidewall spacers 5' are formed on the sidewall of the sacrificial film 3. The etching used in this process is an anisotropic etching, and a RIE method is one example thereof.

Figure 6:
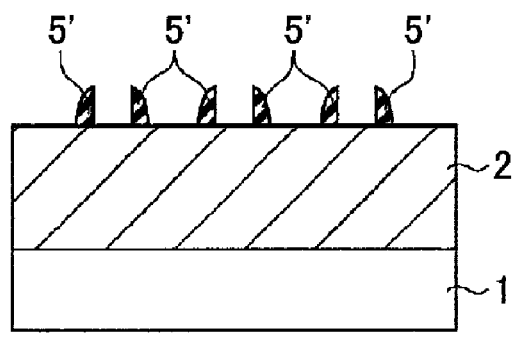
FIG. 6 is a cross sectional view to illustrate a major manufacturing process of the patterning method in accordance with the first embodiment of the present invention.

Subsequently, as illustrated in FIG. 6, the processed sacrificial film 3 is removed by using the sidewall spacers 5' and the thin film 2 as a mask. An example of an etchant used for removing the sacrificial film 3 is, for example, hot phosphoric acid (hot $H_3PO_4$) when the sacrificial film 3 is a SiBN film. In addition, the etching can be performed by using an etchant containing SC-1 (mixed solution of ammonia and oxygenated water). By using a wet etching in removing the sacrificial film 3, it becomes easy to remove the sacrificial film 3.

Thereafter, as illustrated in FIG. 7, the thin film 2 is etched by using the sidewall spacers 5' as an etching mask, so that the thin film 2 is formed into a pattern having a preset interval. Since a width Wt of the patterned thin film 2 along the plane direction is equal or almost equal to the width Wss of sidewall spacers 5', the width Wt can be set to be below or equal to the resolution limit.

As described above, in accordance with the first embodiment of the present invention, it is possible to form the micro pattern of the thin film 2 having the width Wt below or equal to the resolution limit.

Such a micro pattern can be used in, for example, an integrated circuit pattern arranged in a high density such as gate electrodes of a transistor or bit-lines of a semiconductor memory. In other words, the patterning method in accordance with the first embodiment can be appropriately applied to a gate electrode forming process or a bit-line forming process in an integrated circuit manufacturing process.

Further, in accordance with the first embodiment, the sacrificial film 3 is a film containing SiBN. In this manner, the sacrificial film 3 can be easily removed while having the sufficient strength, and a micro pattern of the thin film (underlying film) 2 having a width no greater than the resolution limit can be formed with excellent reproducibility and stability. In the present embodiment, as an example, the sacrificial film 3 is a SiBN film.

FIG. 8 shows properties of a film which is usable as the sacrificial film 3. As illustrated in FIG. 8, MLD-SiN, CVD-SiN (low temperature film formation), CVD-SiN (high temperature film formation), Th—$SiO_2$ (thermal oxide film) and SiBN are some examples of the film which is usable as the sacrificial film 3.

Among them, a film forming temperature (Temp.) of SiBN is 550° C., and thus its film property can become strong in comparison to that of MLD-SiN (film forming temperature=450° C.) or CVD-SiN (low temperature film formation: film forming temperature=450° C.) and SiBN can obtain sufficient strength as the sacrificial film 3 in comparison to MLD-SiN or CVD-SiN (low temperature film formation).

Furthermore, an etching rate of SiBN with respect to dilute hydrofluoric acid (DHF 1%) is 2 nm/min, which is slower than that of MLD-SiN (etching rate=7 nm/min) or CVD-SiN (low temperature film formation: etching rate=47 nm/min). That is, SiBN has etching resistance against the dilute hydrofluoric acid, superior to that of MLD-SiN or CVD-SiN (low temperature film formation).

Further, an etching rate of SiBN with respect to hot phosphoric acid (Hot $H_3PO_4$) exceeds 200 nm/min, which is almost equivalent to an etching rate of MLD-SiN or CVD-SiN (low temperature film formation) with respect to the hot phosphoric acid. That is, SiBN can be easily removed by using the hot phosphoric acid.

Considering only the strength, CVD-SiN (high temperature film formation) or Th—$SiO_2$ is also suitable as the sacrificial film 3, but CVD-SiN (high temperature film formation) or Th—$SiO_2$ is difficult to be etched by the dilute hydrofluoric acid or the hot phosphoric acid, as illustrated in FIG. 8. That is, CVD-SiN (high temperature film formation) or Th—$SiO_2$ has sufficient strength but can not be easily etched. In this respect, SiBN has sufficient strength in comparison to MLD-SiN or CVD-SiN (low temperature film formation), and by using the hot phosphoric acid, it can be easily etched in comparison to CVD-SiN (high temperature film formation) or Th—$SiO_2$.

Accordingly, by making the sacrificial film 3 with a film containing SiBN, it is possible to obtain the sacrificial film 3 which can be easily removed while having the sufficient strength. By using such sacrificial film 3, a micro pattern of the thin film (underlying film) 2 having a width no greater than the resolution limit can be formed with excellent reproducibility and stability.

Furthermore, in the first embodiment, since it is possible to form a micro pattern below or equal to the resolution limit of the exposure apparatus, even if a dry type exposure apparatus is used as an exposure apparatus for use in the photolithography, a micro pattern almost equivalent to that formed by a liquid immersion type exposure apparatus can be formed. Of course, the liquid immersion type exposure apparatus can be used.

Second Embodiment

FIGS. 9 to 16 provide cross sectional views to illustrate every major manufacturing process of a patterning method in accordance with a second embodiment of the present invention.

The second embodiment illustrates an example of a patterning method in accordance with the present invention which can be more appropriately applied to an actual semiconductor process.

First, as illustrated in FIG. 9, on a semiconductor substrate 1, an etching stopper film 6 is formed as a first thin film. The etching stopper film 6 has a function of stopping the etching when a thin film formed afterward is etched. In the present embodiment, the etching stopper film 6 is a silicon nitride film, for example. Subsequently, on the etching stopper film 6, there is formed a thin film 2 made of a material different from that of the etching stopper film 6. In the present embodiment, the thin film 2 is, e.g., a conductive polysilicon film, which is the same as the first embodiment. Then, on the thin film 2, formed is a hard mask film 7 made of a material different from that of the thin film 2. The hard mask film 7 serves as an etching mask when etching the thin film 2. In the present embodiment, the hard mask film 7 is a silicon nitride film, for example. Thereafter, on the hard mask film 7, formed is a sacrificial film 3 made of a material different from that of the hard mask film 7 and made of SiBN.

Figure 10:
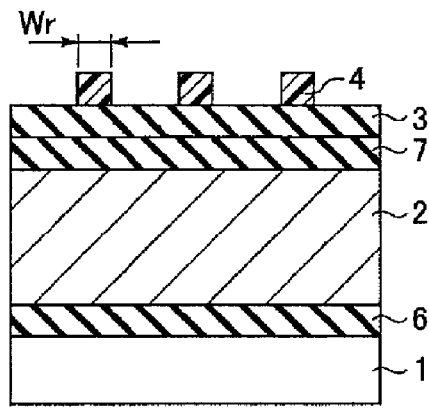
FIG. 10 is a cross sectional view to illustrate a major manufacturing process of the patterning method in accordance with the second embodiment of the present invention.

Subsequently, as illustrated in FIG. 10, photoresist is coated on the sacrificial film 3 so that a photoresist film is formed thereon. Then, by using a photolithography technique, the photoresist film is processed into a resist pattern 4 having a preset interval. In the present embodiment, like in the first embodiment, the resist pattern 4 has a line-and-space pattern, and the interval of the lines is set to be substantially equivalent to a resolution limit of an exposure apparatus. Also in the present embodiment, a width Wr of the resist pattern 4 along a plane direction is set to correspond to the resolution limit.

Figure 11:
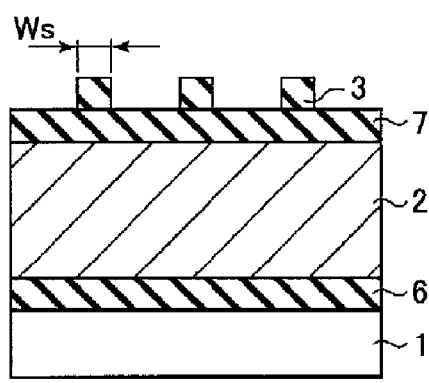
FIG. 11 is a cross sectional view to illustrate a major manufacturing process of the patterning method in accordance with the second embodiment of the present invention.

Thereafter, as illustrated in FIG. 11, the sacrificial film 3 is etched by using the resist pattern 4 as an etching mask and the sacrificial film 3 is processed into a pattern having a predetermined interval. Also in the present embodiment, a width Ws of the processed sacrificial film 3 along a plane direction is the same or almost the same as the width Wr of the resist pattern 4. Furthermore, as an etchant used for etching the sacrificial film 3, for example, hot phosphoric acid is used in case the sacrificial film 3 is a SiBN film.

Figure 12:
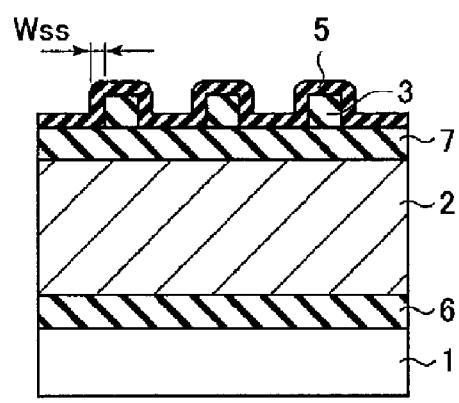
FIG. 12 is a cross sectional view to illustrate a major manufacturing process of the patterning method in accordance with the second embodiment of the present invention.

Then, as shown in FIG. 12, on the processed sacrificial film 3 and the hard mask film 7, there is formed a film 5 different from the sacrificial film 3 and the hard mask film 7. In the present embodiment, like in the first embodiment, the film 5 is a silicon oxide film. An MLD method is an example of a method for forming a silicon oxide film. For example, by depositing the silicon oxide film very thinly at a molecular layer level by using the MLD method, a thickness of the film 5 formed on a sidewall of the sacrificial film 3 can be set to be a width Wss no greater than the resolution limit of the exposure apparatus.

Figure 13:
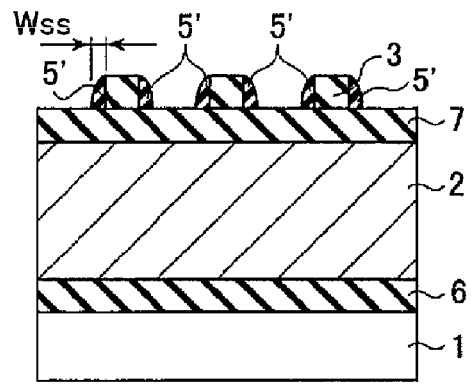
FIG. 13 is a cross sectional view to illustrate a major manufacturing process of the patterning method in accordance with the second embodiment of the present invention.

Thereafter, as illustrated in FIG. 13, a structure shown in FIG. 12 is etched in an anisotropic manner by using, e.g., a RIE method or the like and sidewall spacers 5' are formed on the sidewall of the sacrificial film 3.

Figure 14:
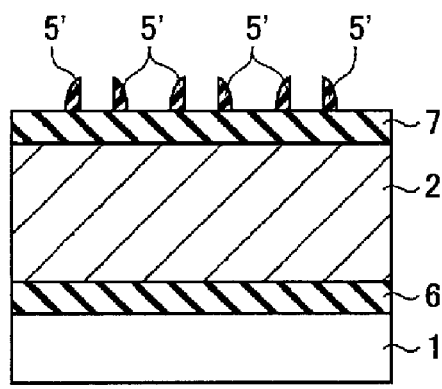
FIG. 14 is a cross sectional view to illustrate a major manufacturing process of the patterning method in accordance with the second embodiment of the present invention.

Subsequently, as illustrated in FIG. 14, the processed sacrificial film 3 is removed by using the sidewall spacers 5' and the hard mask film 7 as a mask, in the same manner as the first embodiment. Further, by using a wet etching in removing the sacrificial film 3, it becomes easy to remove the sacrificial film 3, like in the first embodiment.

Figure 15:
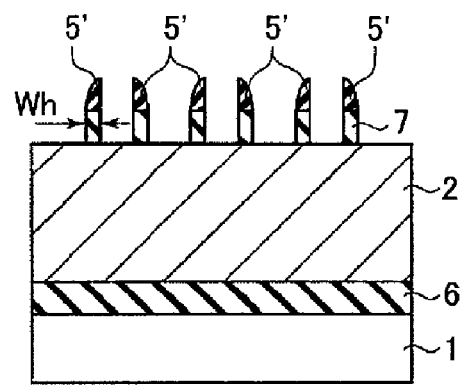
FIG. 15 is a cross sectional view to illustrate a major manufacturing process of the patterning method in accordance with the second embodiment of the present invention.

Thereafter, as illustrated in FIG. 15, the hard mask film 7 is etched by using the sidewall spacers 5' as an etching mask and the hard mask film 7 is processed into a pattern having a preset interval. Since a width Wh of the processed hard mask film 7 along the plane direction is equal or almost equal to a width Wss of the sidewall spacer 5', the width Wh can be set to be below or equal to the resolution limit.

Figure 16:
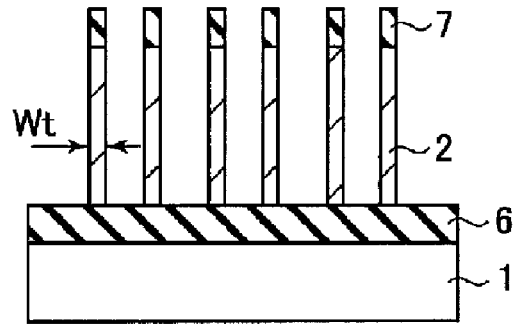
FIG. 16 is a cross sectional view to illustrate a major manufacturing process of the patterning method in accordance with the second embodiment of the present invention.

Subsequently, as shown in FIG. 16, the thin film 2 is processed into a pattern having a preset interval by using the processed hard mask film 7 as a mask after removing the sidewall spacers 5', for example. A width Wt of the processed thin film 2 along the plane direction is equal or almost equal to the width Wh of the hard mask film 7. Accordingly, the width Wt can be set to be no greater than the resolution limit.

As described above, in accordance with the second embodiment of the present invention, it is possible to form the micro pattern of the thin film 2 having the width Wt below or equal to the resolution limit.

In the second embodiment, since a film containing SiBN is used as the sacrificial film 3 in the same manner as the first embodiment, the same advantage as that of the first embodiment is achieved.

Furthermore, in the second embodiment, the etching stopper film 6 is formed under the thin film 2, and the hard mask film 7 is formed on the thin film 2. Thus, in comparison with, e.g., the case of processing the thin film 2 by etching the thin film 2 by using the sidewall spacers 5' as a mask, it is possible to process the thin film 2 having a thickish film thickness. In addition, since the etching of the thin film 2 is stopped at the etching stopper film 6, excessive etching under the thin film 2 can be prevented even in case the thin film 2 having the thickish film thickness is etched. From these advantages, in accordance with the second embodiment, a pattern of the thin film 2 having, e.g., a high aspect ratio (height/width) can be formed. The pattern of the thin film 2 having the high aspect ratio has a large cross section though its area is small, when seen from a plane view. Therefore, resistance can be reduced, and it has advantages when applied to a wiring pattern, e.g., a bit-line pattern of a semiconductor memory, or the like.

Further, by using a gate insulating film such as a thermal oxide film as a first thin film and using polysilicon or the like to be formed as a gate electrode as a second thin film, it becomes possible to fabricate a miniaturized gate structure.

Hitherto, the present invention has been explained in accordance with some embodiments, but it is not limited thereto and various modifications can be made.

For example, in the first and second embodiments, though the thin film 2 is conductive polysilicon, it may be other conductive films such as conductive amorphous silicon or conductive silicon or it may be a $SiO_2$ based insulating film such as a silicon oxide film or a silicon oxynitride (SiON) film.

Figure 17A:
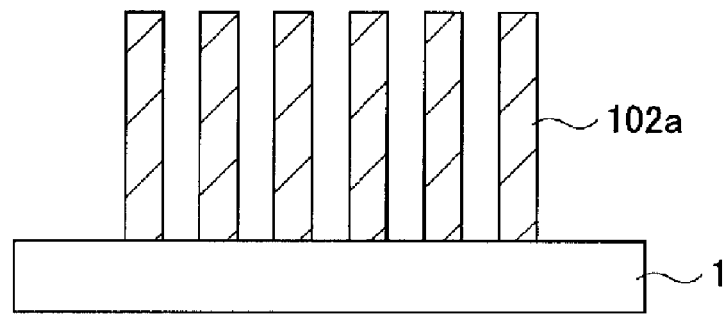
FIG. 17A is a cross sectional view to describe a semiconductor device manufacturing method which can be performed subsequently to the patterning method in accordance with the first embodiment or the second embodiment.
Figure 17B:
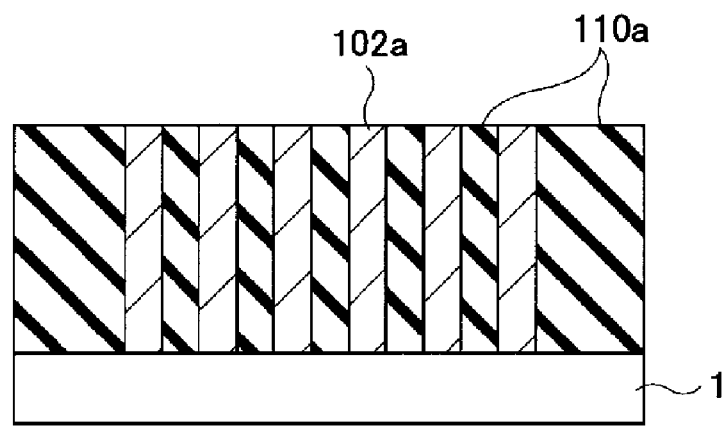
FIG. 17B is a cross sectional view to describe a semiconductor device manufacturing method which can be performed subsequently to the patterning method in accordance with the first embodiment or the second embodiment.

In addition, the patterning method described in the first embodiment can be developed into a method for manufacturing a semiconductor device by continuing the following process. That is, if there is performed a step for removing the sidewall spacers 5' used as the etching mask after performing a step for obtaining the micro pattern by etching the thin film 2 (see FIG. 7) in case that the thin film 2 as the target of the etching is made of an insulating material such as silicon nitride or the like, the micro pattern (hereinafter, referred to as "insulating film 102a" for the convenience of explanation) is left on the semiconductor substrate 1, as shown in FIG. 17A. Subsequently, if there are performed a step for filling gaps of the insulating film 102a with a semiconductor, e.g., silicon and a step for exposing the top surface of the insulating film 102a by planarizing the buried semiconductor, the insulating film 102a and silicon portions 110a are arranged alternately, as illustrated in FIG. 17B. Thus, it is possible to manufacture a semiconductor device in which the silicon portions 110a serve as a device region, while the insulating film 102a functions as a device isolation region. Furthermore, it may be also possible to perform a conduction control (control of a conduction type and/or conductivity) by adding certain impurities into the semiconductor when filling the gaps of the insulating film 102a. Moreover, it may be also possible to perform a step of burying a semiconductor instead of the step of removing the sidewall spacers 5', because the sidewall spacers 5' can be still removed in the planarizing step. However, removing the sidewall spacers 5' in advance is more desirable because it allows a reduction of an aspect ratio when burying the gaps of the insulating film 102a with the semiconductor.

Besides, after etching the thin film 2 (see FIG. 16) by the patterning method in accordance with the second embodiment, it may be possible to perform a step of removing the hard mask film 7 (only if necessary), the step of burying the semiconductor and the planarizing step, in the same manner as each step described above. In the patterning method in accordance with the second embodiment, since the thin film 2 as an etching target is etched by the hard mask film 7 formed into a micro pattern, the thin film 2 can be made of silicon oxide or silicon oxynitride (depending on a composition ratio) if the hard mask film 7 is made of, for example, the silicon nitride. That is, it is possible to manufacture a desired semiconductor device by selecting one of the patterning methods in accordance with the first and second embodiments depending on the insulating material constituting the thin film 2.

Figure 18A:
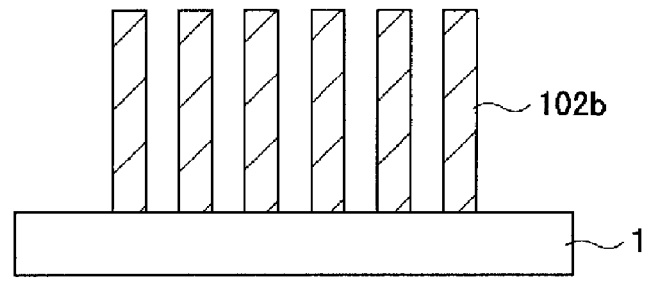
FIG. 18A is a cross sectional view to describe a semiconductor device manufacturing method which can be performed subsequently to the patterning method in accordance with the first embodiment or the second embodiment.
Figure 18B:
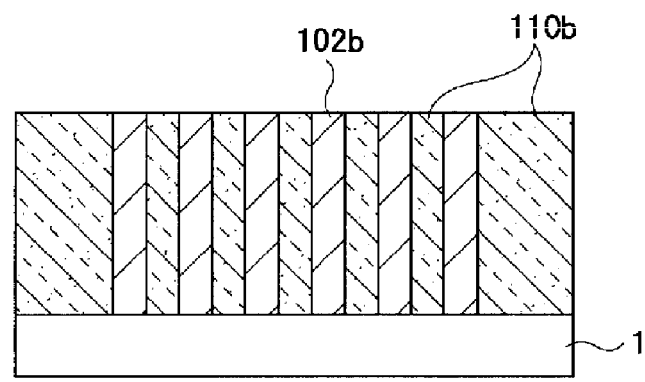
FIG. 18B is a cross sectional view to describe a semiconductor device manufacturing method which can be performed subsequently to the patterning method in accordance with the first embodiment or the second embodiment.

Furthermore, if there is performed a step for removing the sidewall spacers 5' (FIG. 7) or the hard mask film 7 (FIG. 16) used as the etching mask after performing a step for obtaining the micro pattern by etching the thin film 2 (see FIGS. 7 and 16) in case that the thin film 2 as the target of the etching is formed of a semiconductor, e.g., silicon, as illustrated in FIG. 18A, the micro pattern (hereinafter, referred to as "silicon film 102b" for the convenience of explanation) is left on the semiconductor substrate 1. Subsequently, if there are performed a step for filling gaps of the silicon film 102b with an insulating material such as silicon oxide, silicon oxynitride, silicon nitride or the like and a step for exposing the top surface of the silicon film 102b by planarizing the buried insulating material, the silicon film 102b and insulting portions 110b are arranged alternately, as illustrated in FIG. 18B. Thus, it is possible to manufacture a semiconductor device in which the silicon film 102b serves as a device region, while the insulating portions 110b function as a device isolation region. Furthermore, in case that the thin film 2 is made of the semiconductor, it may be also possible to perform a conduction control (control of a conduction type and/or conductivity) by previously adding certain impurities into the thin film 2 by ion implantation. Further, in case of forming the thin film 2 by CVD or the like, it may be also possible to perform a conduction control by adding impurities by using certain dopant gases. Moreover, it may be also possible to perform a step of burying an insulating material instead of the step of removing the sidewall spacers 5' or the hard mask film 7, because the sidewall spacers 5' or the hard mask film 7 can be still removed in the planarizing step. However, removing the sidewall spacers 5' or the hard mask film 7 in advance is more desirable because it allows a reduction of an aspect ratio when burying the gaps of the silicon film 102b with the insulating material.

Moreover, in case the thin film 2 is the semiconductor, it is desirable to select one of the patterning methods in accordance with the first and second embodiments according to, for example, the thickness of the thin film 2 instead of the material constituting the thin film 2.

Figure 19:
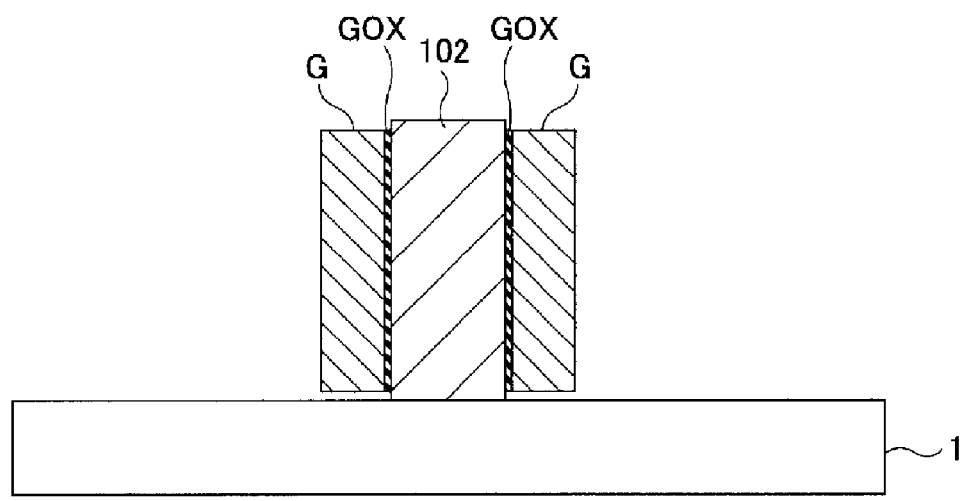
FIG. 19 is a cross sectional view showing an example of a semiconductor device which can be manufactured by using the patterning method in accordance with the first embodiment or the second embodiment.

Moreover, the patterning methods in accordance with the first and second embodiments can be employed for the manufacture of a semiconductor device shown in FIG. 19. FIG. 19 is a cross sectional view of a so-called Fin type field effect transistor (FET) including a thin film 102 formed by any one of the patterning methods in accordance with the first and second embodiments; insulating layers GOX formed to interpose the thin film 102 therebetween; and electrode layers G in contact with the insulating layers GOX. Since the thin film 102 having a narrower width than the resolution limit of an exposure apparatus for use in a photolithography process can be formed by the patterning methods in accordance with the embodiments of the present invention, the Fin type FET can be miniaturized, and integration density can be improved.

In addition, in the above-stated embodiments, various modifications may be made without changing essential features of the present invention.

The present international application claims the benefit of Japanese Patent Application Ser. No. 2007-151065, filed on Jun. 7, 2007, of which specification, claims and drawings are hereby incorporated by reference in its entirety.

What is claimed is:

1. A patterning method comprising:
   forming a thin film on a substrate;
   forming, on the thin film, a sacrificial film made of a material different from that of the thin film and made of SiBN;
   processing the sacrificial film into a preset pattern by using a photolithography technique;
   forming, on sidewalls of the processed sacrificial film, sidewall spacers made of a material different from those of the sacrificial film and the thin film;
   removing the processed sacrificial film; and
   processing the thin film by using the sidewall spacers as a mask.

2. The patterning method of claim 1, wherein the thin film is one of a conductive film containing silicon and a $SiO_2$-based insulating film.

3. The patterning method of claim 1, wherein the sacrificial film made of SiBN is removed by using one of an etching solution containing phosphoric acid and an etching solution containing a mixed solution of ammonia and oxygenated water.

4. The patterning method of claim 1, wherein the preset pattern has a dimension equivalent to a resolution limit of an exposure apparatus for use in the photolithography technique.

5. A patterning method comprising:
   forming a first thin film on a substrate;
   forming, on the first thin film, a second thin film made of a material different from that of the first thin film;
   forming, on the second thin film, a hard mask film made of a material different from that of the second thin film;
   forming, on the hard mask film, a sacrificial film made of SiBN;
   processing the sacrificial film into a pattern having a preset interval by using a photolithography technique;
   forming, on sidewalls of the processed sacrificial film, sidewall spacers made of a material different from those of the sacrificial film and the hard mask film;
   removing the sacrificial film;
   processing the hard mask film by using the sidewall spacers as a mask; and
   processing the second thin film by using the hard mask film as a mask.

6. The patterning method of claim 5, wherein the second thin film is one of a conductive film containing silicon and a $SiO_2$-based insulating film.

7. The patterning method of claim 5, wherein the processed second thin film functions as a bit-line of a semiconductor memory.

8. The patterning method of claim 5, wherein the first thin film is an etching stopper film.

9. The patterning method of claim 5, wherein the processed second thin film functions as a gate electrode and the first thin film functions as a gate insulating film.

10. The patterning method of claim 5, wherein the sacrificial film made of SiBN is removed by using one of an etching solution containing phosphoric acid and an etching solution containing a mixed solution of ammonia and oxygenated water.

11. The patterning method of claim 5, wherein the pattern has a dimension equivalent to a resolution limit of an exposure apparatus for use in the photolithography technique.

* * * * *